US011472568B2

(12) United States Patent
Schwartz et al.

(10) Patent No.: US 11,472,568 B2
(45) Date of Patent: Oct. 18, 2022

(54) PROGNOSTIC MONITORING OF COMPLEMENTARY AIR DATA SYSTEM SENSORS

(71) Applicant: Rosemount Aerospace Inc., Burnsville, MN (US)

(72) Inventors: Wesley J. Schwartz, Bloomington, MN (US); Brian Brent Naslund, Chanhassen, MN (US); John D. Winter, Apple Valley, MN (US); Joel Boelke, Eden Prairie, MN (US)

(73) Assignee: ROSEMOUNT AEROSPACE INC., Burnsville, MN (US)

( * ) Notice: Subject to any disclaimer, the term of this patent is extended or adjusted under 35 U.S.C. 154(b) by 792 days.

(21) Appl. No.: 16/414,539

(22) Filed: May 16, 2019

(65) Prior Publication Data
US 2020/0361627 A1    Nov. 19, 2020

(51) Int. Cl.
*B64D 45/00*    (2006.01)
*G01L 13/00*    (2006.01)
(Continued)

(52) U.S. Cl.
CPC .............. *B64D 45/00* (2013.01); *G01L 13/00* (2013.01); *G01P 13/025* (2013.01);
(Continued)

(58) Field of Classification Search
CPC ..... G01R 31/008; G01R 31/2829; G01P 5/16; G01P 13/025; G01P 21/025; G06N 3/02;
(Continued)

(56) References Cited

U.S. PATENT DOCUMENTS 5,841,537 A * 11/1998 Doty ...................... G01C 19/72
                                                            701/500
6,996,419 B1    1/2006 D'Quince et al.
(Continued)

FOREIGN PATENT DOCUMENTS

EP    2775457 A1 * 9/2014 ............. G06F 17/00

OTHER PUBLICATIONS

J. Low, P. Chee and E. Lim, "Deformable Liquid Metal Patch Antenna for Air Pressure Detection," in IEEE Sensors Journal, vol. 20, No. 8, pp. 3963-3970, Apr. 15, 15, 2020, doi: 10.1109/JSEN.2019.2961514. (Year: 2020).*
(Continued)

*Primary Examiner* — Cuong H Nguyen
(74) *Attorney, Agent, or Firm* — Kinney & Lange, P.A.

(57) ABSTRACT

A aircraft health management system for identifying an anomalous signal from one or more air data systems (ADS) includes one or more of a frequency processor, configured to provide a spectral signal that is representative of a frequency content of the first ADS signal, a noise processor, configured to provide a noise signal that is representative of a noise level of the first ADS signal, and a rate processor, configured to provide a rate signal that is representative of a rate of change of the first ADS signal. The aircraft health management system also includes a comparator configured to provide a differential signal between the first ADS signal and the second ADS signal, and a prognostic processor configured to determine if the ADS signal is anomalous by comparing values representative of a flight condition signal, the differential signal, and the spectral, noise, and/or rate signals.

20 Claims, 3 Drawing Sheets

(51) Int. Cl.
*G01P 13/02* (2006.01)
*G06F 17/14* (2006.01)
*G06N 3/02* (2006.01)

(52) U.S. Cl.
CPC ............. *G06F 17/142* (2013.01); *G06N 3/02* (2013.01); *B64D 2045/0085* (2013.01)

(58) Field of Classification Search
CPC ................. G06F 17/142; B64D 45/00; B64D 2045/0085; G01L 27/007; G01L 13/00
USPC ..................................... 701/3, 5, 7; 244/4 R
See application file for complete search history.

(56) References Cited

U.S. PATENT DOCUMENTS

| | | | |
|---|---|---|---|
| 7,257,470 | B2 | 8/2007 | Hongerholt et al. |
| 8,718,955 | B2 * | 5/2014 | Golly ..................... G01P 13/025 702/50 |
| 8,942,882 | B2 * | 1/2015 | Swearingen ........... B64D 45/00 340/439 |
| 9,211,961 | B2 | 12/2015 | Madhavanpillai et al. |
| 9,229,447 | B2 | 1/2016 | Feau |
| 9,435,661 | B2 * | 9/2016 | Brenner ............... G05D 1/0808 |
| 9,476,962 | B2 * | 10/2016 | Murphy ..................... G01S 5/08 |
| 9,719,782 | B2 * | 8/2017 | Morrison ............. G01C 21/165 |
| 9,919,812 | B2 * | 3/2018 | Shi .......................... B64D 15/12 |
| 10,048,288 | B2 * | 8/2018 | Benning .................. G01P 21/00 |
| 10,147,244 | B2 * | 12/2018 | Atalla .................... G01P 13/025 |
| 11,209,330 | B2 * | 12/2021 | Golly ..................... G01L 13/00 |
| 11,220,357 | B2 * | 1/2022 | Best .......................... G01L 15/00 |
| 2007/0130096 | A1 | 6/2007 | Selvig et al. |
| 2011/0184701 | A1 | 7/2011 | Orme et al. |
| 2012/0123704 | A1 | 5/2012 | Golly et al. |
| 2013/0197739 | A1 | 8/2013 | Gallagher et al. |
| 2014/0257624 | A1 * | 9/2014 | Safa-Bakhsh ........ G07C 5/0808 701/32.7 |
| 2016/0052642 | A1 * | 2/2016 | Gordon ................... B64C 25/34 701/3 |
| 2017/0184469 | A1 * | 6/2017 | Chang ....................... B64F 5/40 |
| 2017/0184650 | A1 * | 6/2017 | Chang .................... G07C 5/006 |
| 2017/0276790 | A1 | 9/2017 | Lodden et al. |
| 2017/0370960 | A1 * | 12/2017 | Benning ............. G01K 13/028 |
| 2018/0299293 | A1 | 10/2018 | Ell |
| 2019/0112068 | A1 | 4/2019 | Lyons et al. |

OTHER PUBLICATIONS

Y. Cheng, J. Wu, H. Zhu, S. W. Or and X. Shao, "Remaining Useful Life Prognosis Based on Ensemble Long Short-Term Memory Neural Network," in IEEE Transactions on Instrumentation and Measurement, vol. 70, pp. 1-12, 2021, Art No. 3503912, doi: 10.1109/TIM.2020.3031113. (Year: 2021).*

B. Zaghari et al., "High-Temperature Self-Powered Sensing System for a Smart Bearing in an Aircraft Jet Engine," in IEEE Transactions on Instrumentation and Measurement, vol. 69, No. 9, pp. 6165-6174, Sep. 2020, doi: 10.1109/TIM.2020.2971288. (Year: 2020).*

E. M. D. Fisher et al., "A Custom, High-Channel Count Data Acquisition System for Chemical Species Tomography of Aero-Jet Engine Exhaust Plumes," in IEEE Transactions on Instrumentation and Measurement, vol. 69, No. 2, pp. 549-558, Feb. 2020, doi: 10.1109/TIM.2019.2895932 (Year: 2020).*

M. Ciminello, "Distributed Fiber Optic for Structural Health Monitoring System Based on Auto-Correlation of the First-Order Derivative of Strain," in IEEE Sensors Journal, vol. 19, No. 14, pp. 5818-5824, Jul. 15, 15, 2019, doi: 10.1109/JSEN.2019.2903911 (Year: 2019).*

Extended European Search Report dated Jun. 30, 2020, received for corresponding European Application No. 19213776.8, 7 pages.

* cited by examiner

PROGNOSTIC MONITORING OF COMPLEMENTARY AIR DATA SYSTEM SENSORS

BACKGROUND

The present disclosure relates to pressure sensors, and more particularly, to an integrated, prognostic system that determines errors in pressure sensors used for air data systems.

Pressure sensors are known in the aviation art and in other industries for providing absolute, gage, and differential pressure readings to air data systems that are indicative of numerous environmental and/or aircraft parameters during all stages of flight. These pressure indications are provided as signals from various air data systems to an avionics system and other consumers. Several sources of error can affect one or more pressure signals, with examples including debris on or near a pressure port, damage to a pressure port or a sensor element, sensor drift, equipment malfunction, and precipitation, lightning strikes, and other environmental anomalies.

Redundant sensors and systems can be useful in determining failed sensors, and sensor signals that are outside of a normal operating range can also provide an indication of a failure. However, subtle errors can go undetected by current systems. Accordingly, there is a need for the advanced monitoring of pressure sensors in a multi-probe sensor environment that can provide prognostic detection of errors.

SUMMARY

An aircraft health management system for identifying an anomalous signal from one or more air data systems (ADS) includes one or more of a frequency processor, configured to provide a spectral signal that is representative of a frequency content of the first ADS signal, a noise processor, configured to provide a noise signal that is representative of a noise level of the first ADS signal, and a rate processor, configured to provide a rate signal that is representative of a rate of change of the first ADS signal. The aircraft health management system also includes a comparator configured to provide a differential signal between the first ADS signal and the second ADS signal, and a prognostic processor configured to determine if the ADS signal is anomalous by comparing values representative of a flight condition signal, the differential signal, and the spectral, noise, and/or rate signals.

A method of identifying an anomalous signal from one or more air data systems (ADS), each of the one or more ADS configured to provide at least a first air data system (ADS) signal and a second ADS signal from a respective first ADS and a second ADS, includes receiving, from one or more ADS, at least a first ADS signal and a second ADS signal, producing one or more of a spectral signal representative of the frequency content of the first ADS signal by a frequency processor, a noise signal representative of a noise level of the first ADS signal, and a rate signal representative of a rate of change of the first ADS signal by a rate processor, producing a differential signal representative of a difference between the first ADS signal and the second ADS signal by a comparator, and determining by a prognostic processor configured to compare the values representative of the flight condition signal, the differential signal, and the one or more of the spectral signal, the noise signal, the rate signal, if the first ADS signal is anomalous.

DETAILED DESCRIPTION

Figure 1:
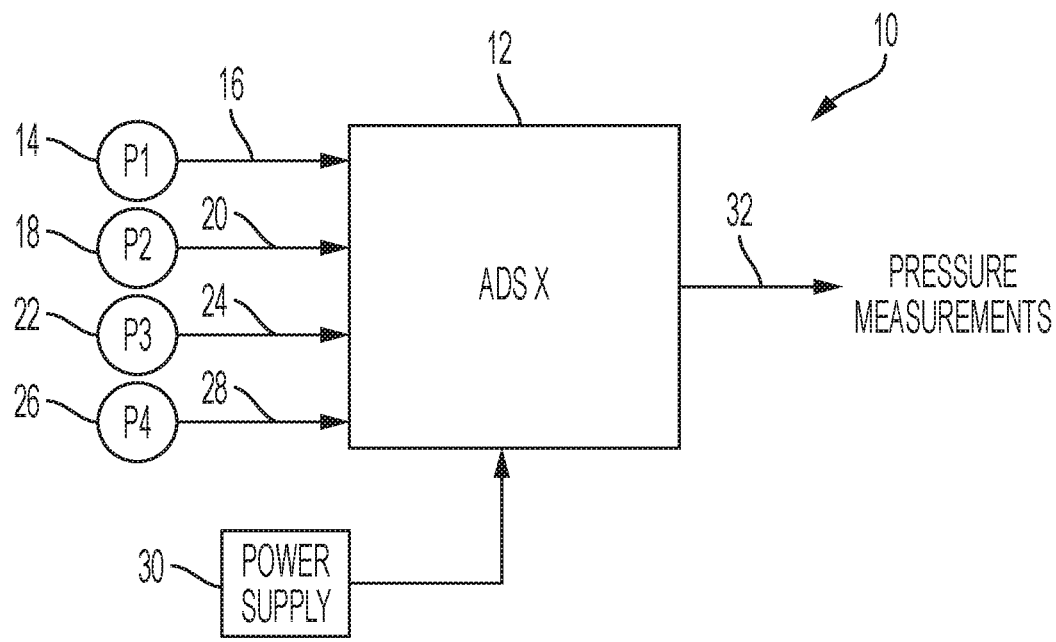
FIG. 1 is a schematic block diagram of an air data system.

FIG. 1 is a schematic block diagram of an air data system (ADS). Shown in FIG. 1 are air data system 10, air data system (ADS) processor 12, pressure sensors 14, 18, 22, 26, pressure sensor output signals 16, 20, 24, 28, power supply 30, and ADS output signal 32. Air data systems 10 are known in the aviation art as being systems used for providing air data such as airspeed and altitude for use by the aircraft and its operators. Air data system 10 is made up of one or more integrated air data probes (i.e., mechanical sensing components mated with electronics that perform sensing processing) that provide four pressure measurements to avionics systems. In an exemplary embodiment, the four pressure measurements include two differential pressure measurements and two absolute pressure measurements. Accordingly, air data system 10 includes ADS processor 12 and pressure sensors 14, 18, 22, 26, each of which provides pressure sensor output signal 16, 20, 24, 28 to ADS processor 12. In the illustrated embodiment, pressure sensors 14, 18, 22, 26 are labeled P1 through P4, respectively. Power supply 20 provides electrical power to ADS processor 12. During operation, pressure sensors 14, 18, 22, 26 each detect an air pressure that is representative of a particular flight characteristic. A particular pressure sensor 14, 18, 22, 26 can measure an absolute pressure (i.e., with respect to a vacuum) or a differential pressure (i.e., a pressure difference between two points). In some embodiments, a particular pressure sensor 14, 18, 22, 26 can measure a gage pressure (i.e., with respect to an atmospheric reference). In other embodiments, air data system 10 (i.e., including pressure sensor 14, 18, 22, 26) can measure any combination of various pressure types (i.e., absolute, differential, and/or gage). During operation, air data system 10 can provide pressure measurements pertaining to various flight conditions of an aircraft (not shown in FIG. 1). Non-limiting examples of pressure-based calculated flight parameters that can be indicated by pressure sensors 14, 18, 22, 26 include calibrated airspeed, true airspeed, indicated airspeed, ground speed, Mach number, pressure altitude, density altitude, barometric-corrected altitude, rate-of-climb, angle-of-attack, angle of slide slip, pitch rate, yaw rate, and wind speed. During operation, ADS processor 12 receives pressure sensor output signal 16, 20, 24, 28 and provides ADS output signal 32 which is representative of the various flight characteristics.

Figure 2:
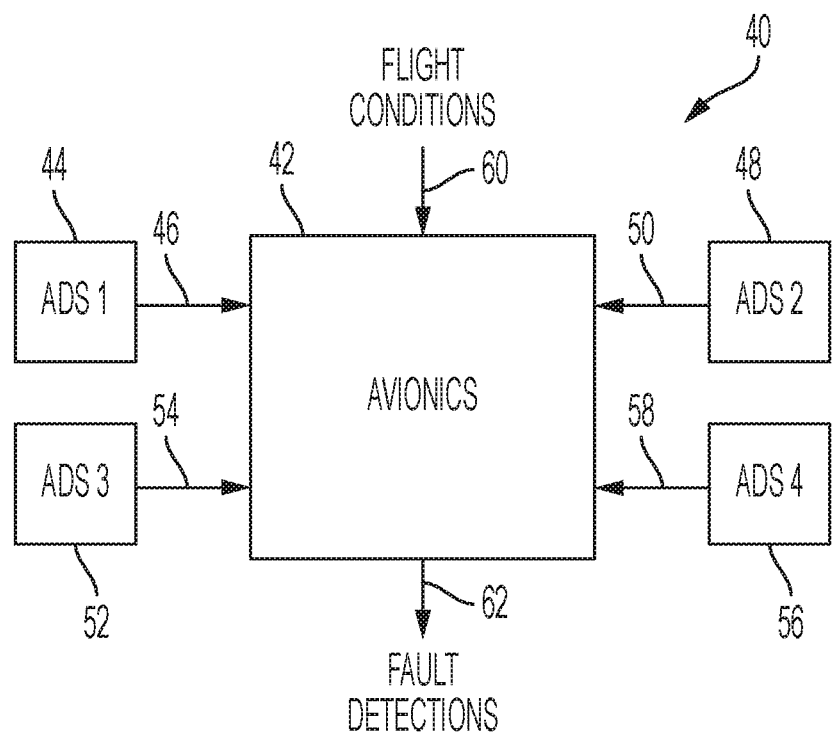
FIG. 2 is a schematic block diagram of an avionics system with four an air data systems.

FIG. 2 is a schematic block diagram of an avionics system with four air data systems. Shown in FIG. 2 are avionics pressure detection system 40, avionics system 42, air data systems 44, 48, 52, 56, ADS output signals 46, 50, 54, 58, flight conditions input signal 60, and fault detections output signal 62. The operation of each air data system 44, 48, 52, 56 is substantially similar to that provided above for air data system 10 in regard to FIG. 1, above. Each respective air data system 44, 48, 52, 56 provides an associated ADS output signal 46, 50, 54, 58 to avionics system 42. Avionics system 42 also receives flight conditions input signal 60, which can be indicative of one or more flight parameters. Non-limiting examples of flight parameters that can be provided in flight conditions input signal 60 include engine power, ground speed, elevation, flaps settings, slat settings, landing gear position, ram air turbine (RAT) deployment state, inertial measurement unit (IMU) parameters (e.g., body rates, body accelerations), wheel speed, weight-on-wheels state, engine throttle settings, fly-by-wire and/or flight controls state, autopilot state (i.e., engaged, not engaged), flight level change, coordinated turn status, barometric correction settings, flight leg, atmospheric conditions (e.g., presence of icing, precipitation, etc.), liquid water content measurements, ice crystal measurements, ice accretion states, aircraft identifier, spoiler state, engine running state, brake pedal position, wind direction, wind speed, gust load alleviation state, radar measurements, GPS measurements, and radio altitude.

During operation, avionics system 42 provides air data to various consumers with non-limiting examples including visible and/or audible indicators to the flight crew on the flight deck, various instrumentation and control systems, and data recording devices (not shown in FIG. 2). Avionics system 42 also provides fault detections output signal 62, which can be indicative of an erroneous sensor. Accordingly, avionics pressure detection system 40 can provide an indication of an erroneous or failed sensor, which can be useful in identifying problems to the flight crew.

It is to be appreciated that under some conditions, some errors can avoid being detected immediately. For example, systematic or common-mode errors can avoid immediate detection. Debris in multiple sensor ports caused by exposure to an industrial environment, precipitation, icing, and volcanic ash are non-limiting examples of a common-mode error that can avoid immediate detection by affecting multiple pressure sensors 14, 18, 22, 26 at one time. Other non-limiting examples of sources of common-mode errors include fuselage damage (e.g., from a bird strike), insect nesting, aircraft power loss, electromagnetic pulse (EMP) events, and maintenance errors. In some cases, low-level degradation can affect performance but can fall below a standard fault annunciation threshold, thereby avoiding detection. In other cases, some faults can be present only under certain abnormal operating conditions (e.g., abnormally high or low temperatures, abnormal flight altitude).

Figure 3:
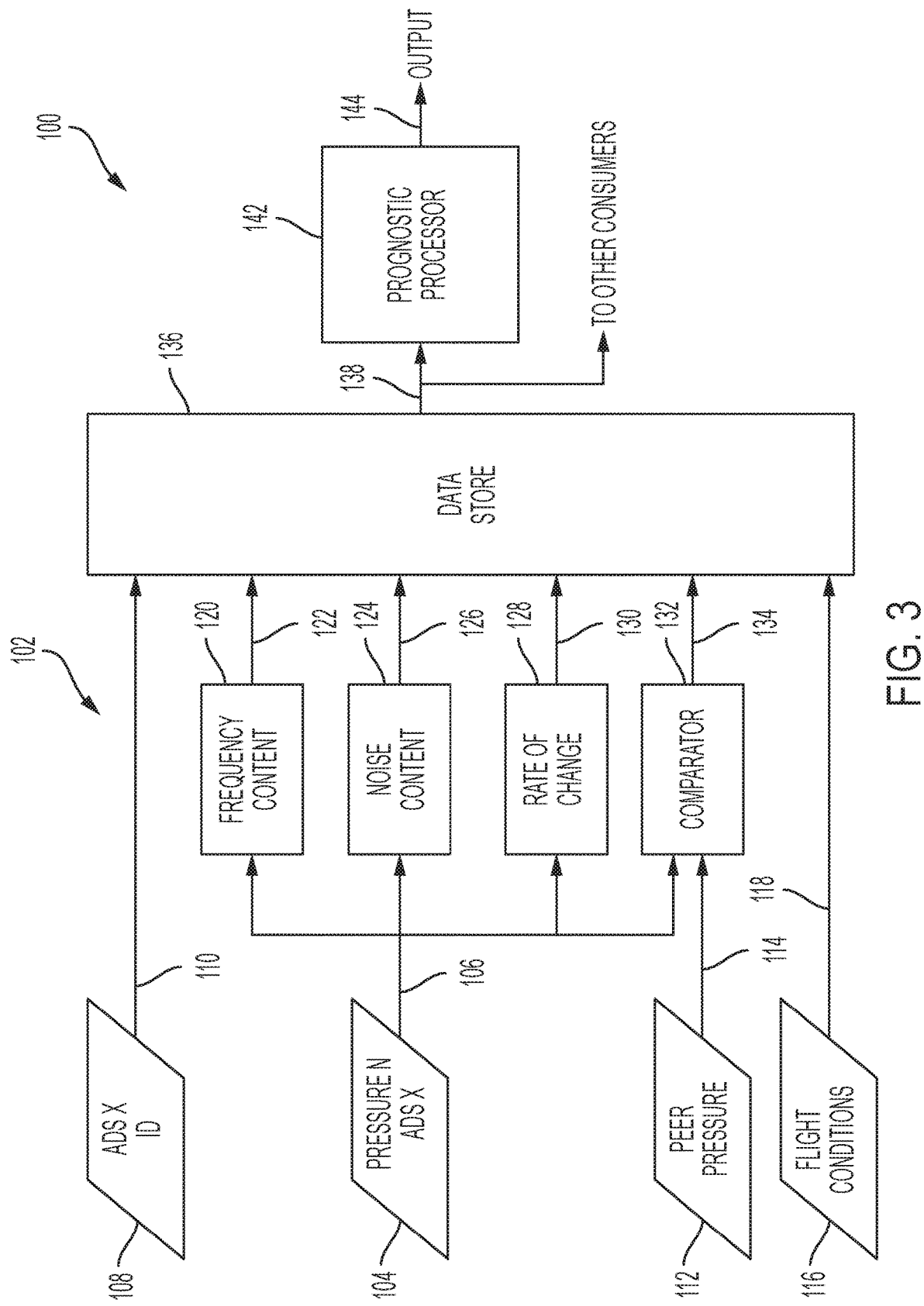
FIG. 3 is a schematic block diagram of a prognostic monitoring system.

FIG. 3 is a schematic block diagram of a prognostic monitoring system. Shown in FIG. 3 are prognostic monitoring system 100, data instance 102, pressure ADS instance 104, pressure ADS instance signal 106, ADS identity 108, ADS identity signal 110, peer pressure instance 112, peer pressure signal 114, flight system 116, flight conditions signal 118, frequency processor 120, spectral signal 122, noise processor 124, noise signal 126, rate processor 128, rate signal 130, comparator 132, differential signal 134, data store 136, data 138, prognostic processor 142, and prognostic processor output 144. As will be described later, prognostic monitoring system 100 receives input from a number of data instances 102, with a particular data instance being shown. During operation, prognostic monitoring system 100 accumulates data from data instance 102. In the illustrated embodiment, four air data systems 44, 48, 52, 56 are used (shown in FIG. 2), each providing an associated ADS output signal 46, 50, 54, 58 as described above in regard to FIG. 2. Pressure ADS instance 104 depicts a particular pressure sensor output signal 16, 20, 24, 28, as shown in FIG. 1. Pressure ADS instance 104 provides pressure ADS instance signal 106 as an output to several processors, described as follows. Pressure ADS instance signal 106 is provided to frequency processor 120, noise processor 124, rate processor 128, and comparator 132. Frequency processor 120 provides spectral signal 124, which is indicative of the frequency content of pressure ADS instance signal 106. In the illustrated embodiment, frequency processor 120 performs a rolling fast Fourier transform (FFT) on pressure ADS instance signal 106. Noise processor 124 provides noise signal 126, which is indicative of the electrical noise level in pressure ADS instance signal 106. In the illustrated embodiment, noise processor 124 performs a rolling standard deviation on pressure ADS instance signal 106, thereby calculating noise signal 126. Rate processor 128 provides rate signal 130, which is indicative of the rate of change of pressure ADS instance signal 106. In the illustrated embodiment, rate processor 128 digitally calculates the rate of change of pressure ADS instance signal 106. Peer pressure instance 112 depicts any particular pressure sensor output signal 16, 20, 24, 28 other than pressure ADS instance 104. Peer pressure instance 112 provides peer pressure signal 114 to comparator 132. Pressure ADS instance signal 106 is also provided to comparator 132, which compares peer pressure signal 114 to pressure ADS instance signal 106, thereby providing differential signal 134. In the illustrated embodiment, comparator 132 performs a digital comparison between pressure ADS instance signal 106 and peer pressure signal 114. Data instance 102, as shown in FIG. 3, depicts a series of calculations that are being performed on a particular pressure ADS instance signal 106. In the embodiment shown in FIGS. 1-3, four air data systems 44, 48, 52, 56 each provided four pressure signals (e.g., pressure sensor output signals 16, 20, 24, 28, as provided by any particular air data system). Accordingly, in the illustrated embodiment, data instance 102 depicts one of sixteen overall data instances within prognostic monitoring system 100.

Referring again to FIG. 3, spectral signal 122, noise signal 126, rate signal 130, and differential signal 134 are provided as inputs to data store 126. ADS identity 108 also provides ADS identity signal 110 to data store 126, thereby identifying the identity of the particular ADS. Non-limiting examples of data that can be included in ADS identity signal 110 include part number, part serial number, software version, and installation location. Accordingly, ADS identity signal 110 associates the particular pressure ADS instance signal 106, from which spectral signal 122, noise signal 126, rate signal 130, and differential signal 134 are provided. Flight system 116 generates flight conditions signal 118 which is also provided to data store 136. Accordingly, data store 136 receives and accumulates data 138. In the illustrated embodiment, flight conditions signal 118 is indicative of the physical characteristics and location of an aircraft. Non-limiting examples of information that can be included in flight conditions signal 118 include calibrated airspeed, true airspeed, indicated airspeed, ground speed, Mach number, pressure altitude, density altitude, barometric-corrected altitude, rate-of-climb, angle-of-attack, angle of slide slip, pitch rate, yaw rate, wind speed, engine power, ground speed, elevation, flaps settings, slat settings, landing gear position, ram air turbine (RAT) deployment state, inertial measurement unit (IMU) parameters (e.g., body rates, body accelerations), wheel speed, weight-on-wheels state, engine throttle settings, fly-by-wire and/or flight controls state, autopilot state (i.e., engaged, not engaged), flight level change, coordinated turn status, barometric correction settings, flight leg, atmospheric conditions (e.g., presence of icing, precipitation, etc.), liquid water content measurements, ice crystal measurements, ice accretion states, aircraft identifier, spoiler state, engine running state, brake pedal position, wind direction, wind speed, gust load alleviation state, radar measurements, GPS measurements, and radio altitude as described above in regard to FIGS. 1-2.

During the operation of prognostic monitoring system 100, data store 136 is receiving and accumulating information from the aforementioned sources. It is to be appreciated that the foregoing description pertained to a single data instance 102, and that similar information is being simultaneously being provided by other data instances representative of other air data systems and pressure sensor output signals. In the illustrated embodiment, data store receives and accumulates information pertaining to sixteen data instances. It is to be appreciated that prognostic monitoring system 100 can be in operation during flight operation, prior to flight operation, and following flight operation. Accordingly, data store 136 accumulates flight data, pre-flight data, and post-flight data for a particular aircraft. Prognostic processor 142 receives and processes data 138 from data store 136. It is important to note that data store 136 also provides data 138 (i.e., flight data) to other consumers. In the aviation art, a consumer is any system or component that receives data. Non-limiting examples of other consumers of data 138 include indicating, control, and alarm systems on the flight deck of an aircraft, avionics systems, flight data recorders, and other data storage components. Various other consumers can receive data 138 in real time, and/or in batches. For example, data 138 can be offloaded from prognostic monitoring system 100 for analysis in other systems. As another example, data 138 can be downloaded and provided to engineering teams at the airline's operator, and/or the various component suppliers for review, analysis, and/or archival.

Referring again to FIG. 3, prognostic processor 142 evaluates data 138 to determine if one or more anomalous indications are present. An anomalous indication refers to an indication that contains one or more anomalies, and which can be used to provide an indication of error, drift, failure, predictive failure, and so on. In one respect, prognostic processor 142 performs built-in testing (BIT). Built-in testing can be performed at power-up (i.e., power-up BIT (PBIT)), whereby testing occurs after prognostic monitoring system 100 powers up from a shut-down condition. Built-in testing can also be performed continuously (i.e., continuous BIT (CBIT)), whereby testing occurs continuously or nearly continuously during the operation of prognostic monitoring system 100. Built-in testing can also be performed on command from an external system or from crew member, technician, and so. Under some conditions, BIT (e.g., PBIT, CBIT) can be referred to as diagnostic testing whereby prognostic processor 142 diagnoses an obvious error or a malfunction. Importantly, prognostic processor 142 performs evaluation on data 138 to identify anomalies that could remain undetected by performing diagnostic testing. The following description provides non-limiting examples of prognostic evaluation that can be performed by prognostic processor 142.

Spectral signal 122 for a particular data instance 102 can be compared to spectral signal 122 for other data instances. Additionally, spectral signal 122 for a particular data instance 102 can be compared over time (e.g., from an established baseline). A change in spectral signal 122, or a difference, can be indicative of an anomaly. Noise signal 126 for a particular data instance 102 can be compared to noise signal 126 for other data instances. Additionally, noise signal 126 for a particular data instance 102 can be compared over time (e.g., from an established baseline). A change in noise signal 126, or a difference, can be indicative of an anomaly. Non-limiting examples of anomalies that can affect spectral signal 122 and/or noise signal 126 include mechanical, electro-mechanical, and electrical faults within various pressure sensors 14, 18, 22, 26. Rate signal 130 for a particular data instance 102 can be compared to rate signal 130 for other data instances. Additionally, rate signal 130 for a particular data instance 102 can be compared over time (e.g., from an established baseline). A change in rate signal 130, or a difference, can be indicative of an anomaly. Rate signal 130 can also be compared to flight conditions signal 118, thereby comparing a rate of change of a particular pressure measurement to an expected rate of change as predicted by flight conditions signal 118. Non-limiting examples of anomalies that can affect rate signal 130 include mechanical, electro-mechanical, and electrical faults within various pressure sensors 14, 18, 22, 26. For example, a partial obstruction over a pressure sensing port or in a pressure sensing line can alter the rate of change (i.e., rate signal 130) of a particular pressure measurement as compared to rate signal 130 for other data instances. A comparison between rate signal 130 and flight conditions signal 118 can also indicate an anomalous condition. Differential signal 134 for a particular data instance 102 (i.e., with respect to a particular signal can be compared to differential signal 134 for other data instances. Additionally, differential signal 122 for a particular peer pressure signal 114) can be compared to any other peer pressure signal 114 (i.e., for any other data instances) to provide an indication of an anomaly. An anomaly can result from one or more sources of debris, damage, degradation, or any other source of error as described above in regard to FIG. 2. An anomaly occurring in two or more pressure sensors 14, 18, 22, 26 at one time can be referred to as a common-mode effect, with non-limiting examples including precipitation, icing, debris, volcanic ash, and so on.

In the illustrated embodiment, prognostic processor 142 can include one or more processors (not shown in FIG. 3) that are configured to implement functionality and/or process instructions for execution within prognostic processor 142. For instance, the one or more prognostic processor(s) can be capable of processing instructions stored in one or more storage device(s) (not shown in FIG. 3). Examples of processor(s) can include any one or more of a microprocessor, a controller, a digital signal processor (DSP), an application specific integrated circuit (ASIC), a field-programmable gate array (FPGA), or other equivalent discrete or integrated logic circuitry. In some embodiments, prognostic processor 142 can utilize data and signal analysis processing techniques on data 138. In these or other embodiments, prognostic processor 142 can be a neural network.

In some embodiments, fewer data can be stored in data store 126. For example, in some embodiments, prognostic monitoring system 100 can include only one or more of frequency processor 120, noise processor 124, and rate processor 128. Accordingly, prognostic monitoring system 100 using one or more of spectral signal 122, noise signal 126, and rate signal 130 is within the scope of the present disclosure. In these or other embodiments, prognostic processor output 144 can be provided to any number of systems, with non-limiting examples including indicating, control, and alarm systems on the flight deck of an aircraft, avionics systems, flight data recorders, and other data storage components. Various other systems can receive prognostic processor output 144 in real time, and/or in batches. For example, prognostic processor output 144 can be offloaded from prognostic monitoring system 100 for analysis in other systems. As another example, prognostic processor output 144 can be downloaded and provided to engineering teams at the airline's operator, and/or the various component suppliers for review, analysis, and/or archival.

The present disclosure provides exemplary embodiments of prognostic processor 142 based on four air data systems (e.g., air data systems 44, 48, 52, 56 as shown in FIG. 2), with each air data system having four pressure sensors (e.g., pressure sensors 14, 18, 22, 26 as shown in FIG. 1). Any number of air data systems and/or any number of pressure sensors is within the scope of the present disclosure. An exemplary embodiment was shown and described using pressure measurements from air data systems. In other embodiments, non-pressure ADS data can be used by prognostic monitoring system 100, with non-limiting examples of ADS data including temperature, equipment operating hours/cycles, measured/local/true pressures derived from a sensor pressure paired with appropriate calibration and aircraft data, calibrated airspeed, true airspeed, indicated airspeed, ground speed, Mach number, pressure altitude, density altitude, barometric-corrected altitude, rate-of-climb, angle-of-attack, angle of slide slip, pitch rate, yaw rate, wind speed, engine power, ground speed, elevation, flaps settings, slat settings, landing gear position, ram air turbine (RAT) deployment state, inertial measurement unit (IMU) parameters (e.g., body rates, body accelerations), wheel speed, weight-on-wheels state, engine throttle settings, fly-by-wire and/or flight controls state, autopilot state (i.e., engaged, not engaged), flight level change, coordinated turn status, barometric correction settings, flight leg, atmospheric conditions (e.g., presence of icing, precipitation, etc.), liquid water content measurements, ice crystal measurements, ice accretion states, aircraft identifier, spoiler state, engine running state, brake pedal position, wind direction, wind speed, gust load alleviation state, radar measurements, global positioning system (GPS) coordinates, radio altitude, aircraft body vectors, accelerations, trends, heater state, heater status, monitor state, and built-in test (BIT) results.

The present disclosure provides exemplary embodiments of frequency processing, noise processing, and rate processing. All processing means are within the scope of the present disclosure. For example, in some embodiments, a Wigner transform, continuous wavelet transform, or discrete wavelet transform can be used to provide a spectral signal that is representative of frequency content. In other embodiments, a rolling average comparison, spectral density estimation, or evaluation of noise level with respect to the available margin can be used to provide a noise signal that is representative of noise content. In yet other embodiments, a signal filter can be applied in frequency domain processing to provide a rate signal that is representative of rate content.

Figure 4:
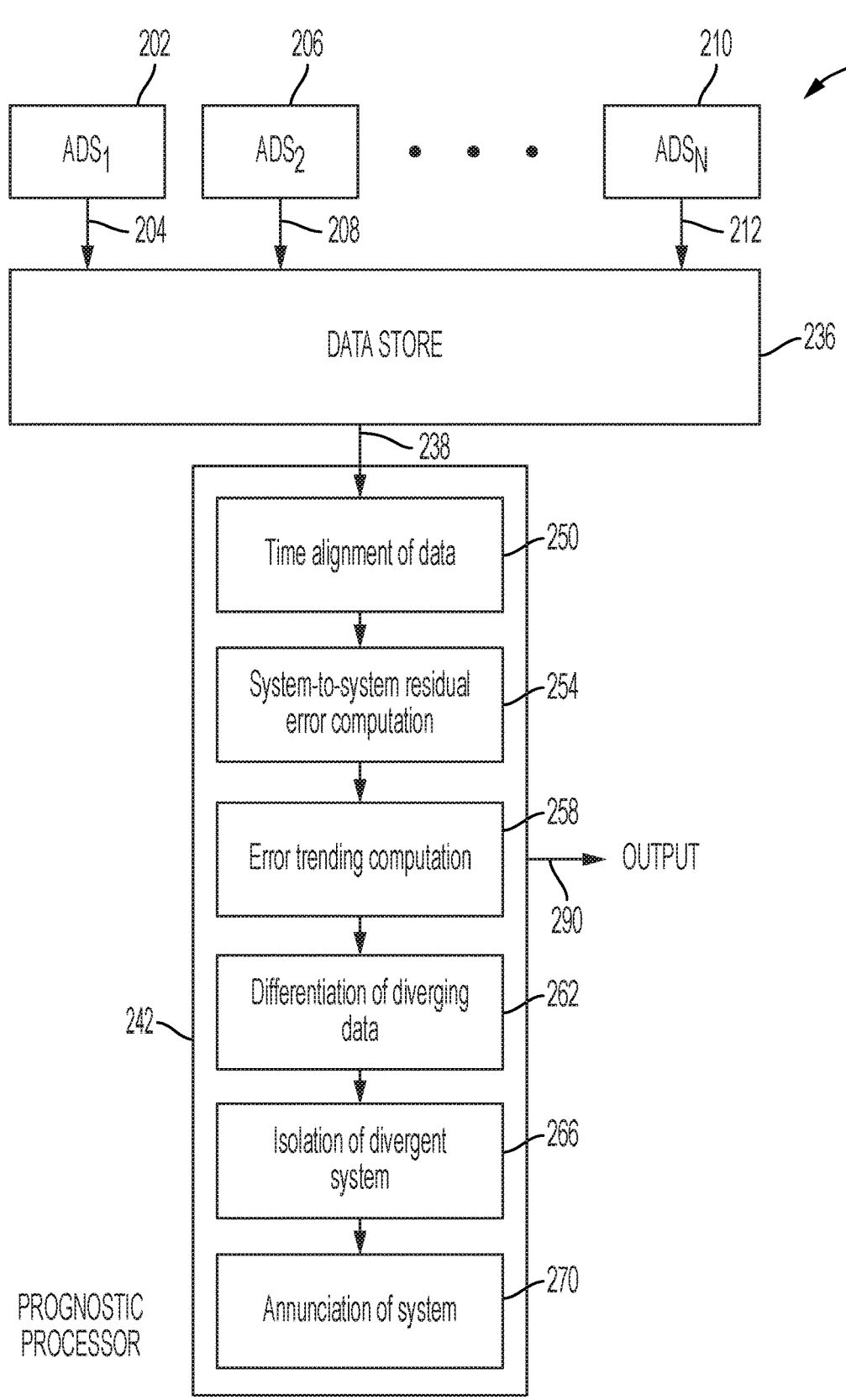
FIG. 4 is a schematic block diagram of a secondary embodiment of the prognostic monitoring system.

FIG. 4 is a schematic block diagram of a secondary embodiment of the prognostic monitoring system. Shown in FIG. 4 are prognostic monitoring system 200, $ADS_1$ 202, $ADS_1$ output signal 204, $ADS_2$ 206, $ADS_2$ output signal 208, $ADS_N$ 210, $ADS_N$ output signal 212, data store 236, data 238, prognostic processor 242, temporal alignment module 250, residual error module 254, error trending module 228, diverging data module 262, diverging system module 266, annunciation module 270, and prognostic processor output 290. In the illustrated embodiment, any number N of air data systems (ADS) can be used, with each ADS providing an input to data store 236. The description of each ADS 202, 206, 210 and respective ADS output signal 204, 208, 212 thereof, is substantially similar to that provided above in regard to FIG. 3. Data 238 are decoupled from the number N of ADS sources, and can be scaled accordingly. Data store 236 provides data 238 to prognostic processor 242, with data 238 representing various pressure or non-pressure indications from respective ADS 202, 206, 210, as described above in regard to FIG. 3.

In the illustrated embodiment, prognostic processor 242 includes several modules (i.e., computational modules), described as follows. In temporal alignment module 250, data 238 are time-aligned to assure that aliasing effects are mitigated. In residual error module 254, a residual error between each ADS output signal 204, 208, 212 is used to form a baseline of total system consistency. Each ADS output signal 204, 208, 212 is validated against all others to provide a full cross-comparison. Residual error module 254 can be referred to as a system-to-system check module. In error trending module 228, each residual of respective ADS output signals 204, 208, 212 is monitored for state change, direction, and magnitude. Diverging data module 262 identifies stable residual error patterns, cross-checking against other ADS output signals 204, 208, 212 to identify a diverging trend. Diverging system module 266 identifies and isolates a particular ADS 202, 206, 210 based on the identification of a diverging trend by diverging data module 262. Annunciation module 270 annunciates (i.e., reports) the identity of one or more ADS (i.e., ADS 202, 206, 210) that are identified by diverging system module 266. In the illustrated embodiment, the identity of the one or more discrepant ADS can be used for any number purposes, with non-limiting examples including flagging the discrepant ADS for closer monitoring and/or scrutiny, reverting the discrepant ADS to a pre-fault condition, scheduling maintenance for the discrepant ADS, and severing the respective ADS output signal from the discrepant ADS. Referring again to FIG. 4, the reporting (i.e., annunciation) provided by annunciation module 270 can be included in prognostic processor output 290, thereby providing an indication of a faulting ADS 202, 206, 210. Prognostic processor output 290 can be provided to any number of systems for any number of uses, as described above in regard to FIG. 3. In the illustrated embodiment, indications provided by one or more of temporal alignment module 250, residual error module 254, error trending module 228, diverging data module 262, and diverging system module 266 can also be included in prognostic processor output 290.

Discussion of Possible Embodiments

The following are non-exclusive descriptions of possible embodiments of the present invention.

An aircraft health management system for identifying an anomalous signal from one or more air data systems (ADSs), each of the one or more ADSs configured to provide at least a first air data system (ADS) signal and a second ADS signal, the aircraft health management system comprising: one or more of a frequency processor, configured to provide a spectral signal that is representative of a frequency content of the first ADS signal; a noise processor, configured to provide a noise signal that is representative of a noise level of the first ADS signal; or a rate processor, configured to provide a rate signal that is representative of a rate of change of the first ADS signal; a comparator, configured to provide a differential signal between the first ADS signal and the second ADS signal; and a prognostic processor, configured to determine, by comparing values representative of a flight condition signal, the differential signal, and at least of the one or more of the spectral signal, the noise signal, or the rate signal, if the first ADS signal is anomalous.

The aircraft health management system of the preceding paragraph can optionally include, additionally and/or alternatively, any one or more of the following features, configurations and/or additional components:

A further embodiment of the foregoing aircraft health management system, wherein the aircraft health management system comprises the frequency processor; and the frequency processor comprises a calculating circuit configured to perform a fast Fourier transform (FFT) on the first ADS signal.

A further embodiment of the foregoing aircraft health management system, wherein the aircraft health management system comprises the rate processor; and the rate processor comprises a calculating circuit configured to perform rolling standard deviation on the first ADS signal.

A further embodiment of the foregoing aircraft health management system, wherein the aircraft health management system comprises the rate processor; and the rate processor comprises a calculating circuit configured to perform a rate of change on the first ADS signal.

A further embodiment of the foregoing aircraft health management system, wherein the flight condition signal comprises one or more values representative of: altitude, airspeed, air temperature, liquid water content (LWC), and/or global positioning system (GPS) position.

A further embodiment of the foregoing aircraft health management system, wherein the prognostic processor is configured to calculate an error magnitude representative of an anomaly, if the first ADS signal is determined to be anomalous.

A further embodiment of the foregoing aircraft health management system, wherein the prognostic processor is configured to generate a predictive health score representative of a health of the one or more ADSs.

A further embodiment of the foregoing aircraft health management system, wherein the prognostic processor comprises a neural network.

A further embodiment of the foregoing aircraft health management system, further comprising a data store, configured to store values representative of: the flight condition signal; the differential signal; and the one or more of the spectral signal, the noise signal, or the rate signal.

A further embodiment of the foregoing aircraft health management system, wherein the first and second ADS signals are each selected from the group consisting of pressure, total air temperature (TAT), calibrated airspeed, true airspeed, indicated airspeed, ground speed, Mach number, pressure altitude, density altitude, barometric-corrected altitude, rate-of-climb, angle-of-attack, angle of slide slip, pitch rate, yaw rate, wind speed, ground speed, elevation, inertial measurement unit (IMU) body rate, IMU body acceleration, aircraft body vectors, aircraft body acceleration, and aircraft body trends.

A further embodiment of the foregoing aircraft health management system, wherein the first ADS signal is a first pressure signal; and the second ADS signal is a second pressure signal.

A further embodiment of the foregoing aircraft health management system, wherein each of the one or more ADSs comprises four pressure detectors; and each of the pressure detectors is selected from the group consisting of: an absolute pressure detector, a differential pressure detector, and a gage pressure detector.

A further embodiment of the foregoing aircraft health management system, further comprising two differential pressure detectors and two absolute pressure detectors.

A method of identifying an anomalous signal from one or more air data systems (ADSs), each of the one or more ADSs configured to provide at least a first air data system (ADS) signal and a second ADS signal, the method comprising: receiving, from one or more ADS, at least a first ADS signal and a second ADS signal; producing one or more of: a spectral signal, by a frequency processor, representative of a frequency content of the first ADS signal; a noise signal, by a noise level processor, representative of a noise level of the first ADS signal; or a rate signal, by a rate processor, representative of a rate of change of the first ADS signal; producing, by a comparator, a differential signal that is representative of a difference between the first ADS signal and the second ADS signal; and determining, by a prognostic processor configured to compare the values representative of the flight condition signal, the differential signal, and at least of the one or more of the spectral signal, the noise signal, or the rate signal, if the first ADS signal is anomalous.

The method of the preceding paragraph can optionally include, additionally and/or alternatively, any one or more of the following features, configurations and/or additional components:

A further embodiment of the foregoing method, wherein the flight condition signal comprises one or more values representative of: altitude, airspeed, air temperature, liquid water content (LWC), and/or global positioning system (GPS) position.

A further embodiment of the foregoing method, wherein the prognostic processor is further configured to: calculate an error magnitude representative of an anomaly, if the first ADS signal is determined to be anomalous; and generate a predictive health score representative of a health of the one or more ADSs.

A further embodiment of the foregoing method, further comprising: associating, by a diverging data module, an error with the respective first or second ADS signal; identifying, by a diverging system module, the respective one or more ADSs as a source of the error; and annunciating, by an annunciation module, the identity of the respective one or more ADSs as a source of the error.

A further embodiment of the foregoing method, wherein the prognostic processor further comprises a data store, configured to store values representative of: the flight condition signal; the differential signal; and the one or more of the spectral signal, the noise signal, and the rate signal.

A further embodiment of the foregoing method, wherein the first and second ADS signals are each selected from the group consisting of pressure, total air temperature (TAT), calibrated airspeed, true airspeed, indicated airspeed, ground speed, Mach number, pressure altitude, density altitude, barometric-corrected altitude, rate-of-climb, angle-of-attack, angle of slide slip, pitch rate, yaw rate, wind speed, ground speed, elevation, inertial measurement unit (IMU) body rate, IMU body acceleration, aircraft body vectors, aircraft body acceleration, and aircraft body trends.

A further embodiment of the foregoing method, wherein the first ADS signal is a first pressure signal; and the second ADS signal is a second pressure signal While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An aircraft health management system for identifying an anomalous signal from one or more air data systems (ADSs), each of the one or more ADSs configured to provide at least a first air data system (ADS) signal and a second ADS signal, the aircraft health management system comprising:
one or more of:
a frequency processor that provides a spectral signal that is representative of a frequency content of the first ADS signal;
a noise processor that provides a noise signal that is representative of a noise level of the first ADS signal; or
a rate processor that provides a rate signal that is representative of a rate of change of the first ADS signal;
a comparator that provides a differential signal between the first ADS signal and the second ADS signal; and
a prognostic processor that determines if the first ADS signal is anomalous, the first ADS signal is determined to be anomalous if there is a change over time in any of the following: i) the spectral signal of the first ADS signal or the differential signal between the spectral signal of the first ADS and the spectral signal from the second ADS; ii) the noise signal of the first ADS or the differential signal between the noise signal of the first ADS and the noise signal of the second ADS; or iii) the rate signal of the first ADS or the differential signal between the rate signal of the first ADS and the rate signal of the second ADS or a differential signal between the rate signal or the first ADS and an expected rate of change as predicted by a flight conditions signal.

2. The aircraft health management system of claim 1, wherein:
the aircraft health management system comprises the frequency processor; and
the frequency processor comprises a calculating circuit configured to perform a fast Fourier transform (FFT) on the first ADS signal.

3. The aircraft health management system of claim 1, wherein:
the aircraft health management system comprises the rate processor; and
the rate processor comprises a calculating circuit configured to perform rolling standard deviation on the first ADS signal.

4. The aircraft health management system of claim 1, wherein:
the aircraft health management system comprises the rate processor; and
the rate processor comprises a calculating circuit configured to perform a rate of change on the first ADS signal.

5. The aircraft health management system of claim 1, wherein the flight condition signal comprises one or more values representative of: altitude, airspeed, air temperature, liquid water content (LWC), and/or global positioning system (GPS) position.

6. The aircraft health management system of claim 1, wherein the prognostic processor is configured to calculate an error magnitude representative of an anomaly, if the first ADS signal is determined to be anomalous.

7. The aircraft health management system of claim 1, wherein the prognostic processor is configured to generate a predictive health score representative of a health of the one or more ADS s.

8. The aircraft health management system of claim 1, wherein the prognostic processor comprises a neural network.

9. The aircraft health management system of claim 1, further comprising a data store, configured to store values representative of:
the flight condition signal;
the differential signal; and
the one or more of the spectral signal, the noise signal, or the rate signal.

10. The aircraft health management system of claim 1, wherein the first and second ADS signals are each selected from the group consisting of pressure, total air temperature (TAT), calibrated airspeed, true airspeed, indicated airspeed, ground speed, Mach number, pressure altitude, density altitude, barometric-corrected altitude, rate-of-climb, angle-of-attack, angle of slide slip, pitch rate, yaw rate, wind speed, ground speed, elevation, inertial measurement unit (IMU) body rate, IMU body acceleration, aircraft body vectors, aircraft body acceleration, and aircraft body trends.

11. The aircraft health management system of claim 1, wherein:
the first ADS signal is a first pressure signal; and
the second ADS signal is a second pressure signal.

12. The aircraft health management system of claim 11, wherein:
each of the one or more ADSs comprises four pressure detectors; and
each of the pressure detectors is selected from the group consisting of: an absolute pressure detector, a differential pressure detector, and a gage pressure detector.

13. The aircraft health management system of claim 12, comprising two differential pressure detectors and two absolute pressure detectors.

14. A method of identifying an anomalous signal from one or more air data systems (ADSs), each of the one or more ADSs configured to provide at least a first air data system (ADS) signal and a second ADS signal, the method comprising:
receiving, from one or more ADS, at least a first ADS signal and a second ADS signal;
producing one or more of:
a spectral signal, by a frequency processor, representative of a frequency content of the first ADS signal;
a noise signal, by a noise level processor, representative of a noise level of the first ADS signal; or
a rate signal, by a rate processor, representative of a rate of change of the first ADS signal;
producing, by a comparator, a differential signal that is representative of a difference between the first ADS signal and the second ADS signal; and
determining, by a prognostic processor, if the first ADS signal is anomalous, the first ADS signal is determined to be anomalous if there is a change over time in any of the following: i) the spectral signal of the first ADS signal or the differential signal between the spectral signal of the first ADS and the spectral signal from the second ADS; ii) the noise signal of the first ADS or the differential signal between the noise signal of the first ADS and the noise signal of the second ADS; or iii) the rate signal of the first ADS or the differential signal between the rate signal of the first ADS and the rate signal of the second ADS or a differential signal between the rate signal or the first ADS and an expected rate of change as predicted by a flight conditions signal.

15. The method of claim 14, wherein the flight condition signal comprises one or more values representative of: altitude, airspeed, air temperature, liquid water content (LWC), and/or global positioning system (GPS) position.

16. The method of claim 14, wherein the prognostic processor is further configured to:
   calculate an error magnitude representative of an anomaly, if the first ADS signal is determined to be anomalous; and
   generate a predictive health score representative of a health of the one or more ADSs.

17. The method of claim 14, further comprising:
   associating, by a diverging data module, an error with the respective first or second ADS signal;
   identifying, by a diverging system module, the respective one or more ADSs as a source of the error; and
   annunciating, by an annunciation module, the identity of the respective one or more ADSs as a source of the error.

18. The method of claim 14, wherein the prognostic processor further comprises a data store, configured to store values representative of:
   the flight condition signal;
   the differential signal; and
   the one or more of the spectral signal, the noise signal, and the rate signal.

19. The method of claim 14 wherein the first and second ADS signals are each selected from the group consisting of pressure, total air temperature (TAT), calibrated airspeed, true airspeed, indicated airspeed, ground speed, Mach number, pressure altitude, density altitude, barometric-corrected altitude, rate-of-climb, angle-of-attack, angle of slide slip, pitch rate, yaw rate, wind speed, ground speed, elevation, inertial measurement unit (IMU) body rate, IMU body acceleration, aircraft body vectors, aircraft body acceleration, and aircraft body trends.

20. The method of claim 14, wherein:
   the first ADS signal is a first pressure signal; and
   the second ADS signal is a second pressure signal.

* * * * *